United States Patent [19]

Cushman

[11] 4,366,467

[45] Dec. 28, 1982

[54] TORQUER CURRENT READOUT SYSTEM FOR INERTIAL INSTRUMENT EMPLOYING CURRENT CONTROLLED OSCILLATOR

[75] Inventor: Glenn F. Cushman, Norfolk, Mass.

[73] Assignee: Northrop Corporation, Los Angeles, Calif.

[21] Appl. No.: 112,417

[22] Filed: Jan. 16, 1980

[51] Int. Cl.³ .............................................. H03K 13/02
[52] U.S. Cl. ........................ 340/347 AD; 340/347 CC
[58] Field of Search .... 340/347 AD, 347 M, 347 CC; 33/325, 317; 73/1 E, 178 R; 364/453; 318/648

[56] References Cited

U.S. PATENT DOCUMENTS

| 2,994,825 | 8/1961 | Anderson | 328/129 |
|---|---|---|---|
| 3,014,210 | 12/1961 | Beaumont | 340/347 AD |
| 3,628,003 | 12/1971 | Spence | 235/92 NT |
| 3,665,305 | 5/1972 | Petrohilis | 324/99 D |
| 3,668,690 | 6/1972 | Ormond | 340/347 CC |
| 3,783,393 | 1/1974 | Kakiura | 328/127 |
| 3,833,903 | 9/1974 | Gordon | 340/347 AD |
| 3,868,677 | 2/1975 | Kidd | 340/347 CC |
| 3,998,088 | 12/1976 | Kazangey | 73/1 E |

OTHER PUBLICATIONS

Taylor "IBM Technical Disclosure Bulletin" vol. 3, No. 10, Mar. 1961, pp. 128–129.
Klimovich "Pribory i Tekhnika Eksperimenta" No. 2, pp. 88–89, Mar.–Apr., 1978 (Translation by Plenum Publishing Corp. ©1978, pp. 361–362.

Primary Examiner—C. D. Miller
Attorney, Agent, or Firm—Kenway & Jenney

[57] ABSTRACT

A system for converting analog torquer current to digital form is based on a current-controlled oscillator, preferably a YIG-tuned microwave oscillator, which produces an output frequency characterized by a nominally constant bias frequency term subject to drift and a tuning frequency term proportional to input current. An automatic calibration circuit gates the input current ON and OFF at a relatively low constant sampling rate. The number of cycles of the high frequency oscillator output is counted separately for the ON and OFF periods. The difference between the ON and OFF period counts is proportional to the input current and independent of the bias frequency. The system is specifically designed for converting analog torquer currents in inertial instruments to computer-compatible form.

20 Claims, 9 Drawing Figures

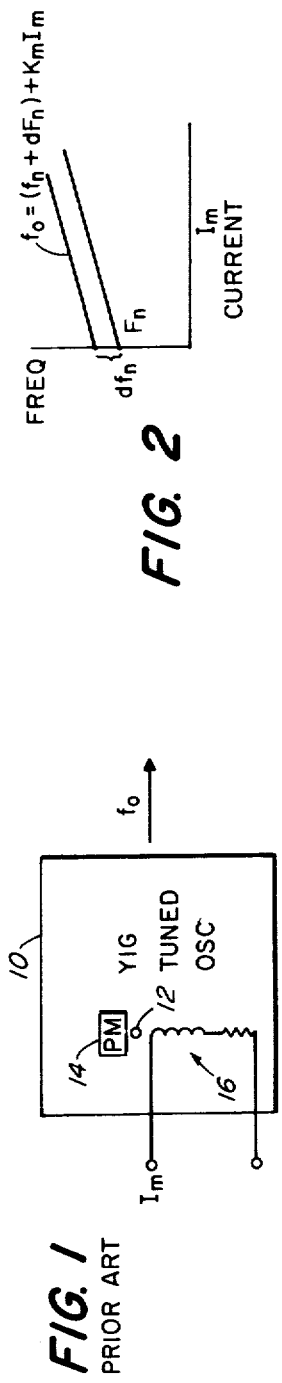
FIG. 1 PRIOR ART
FIG. 2
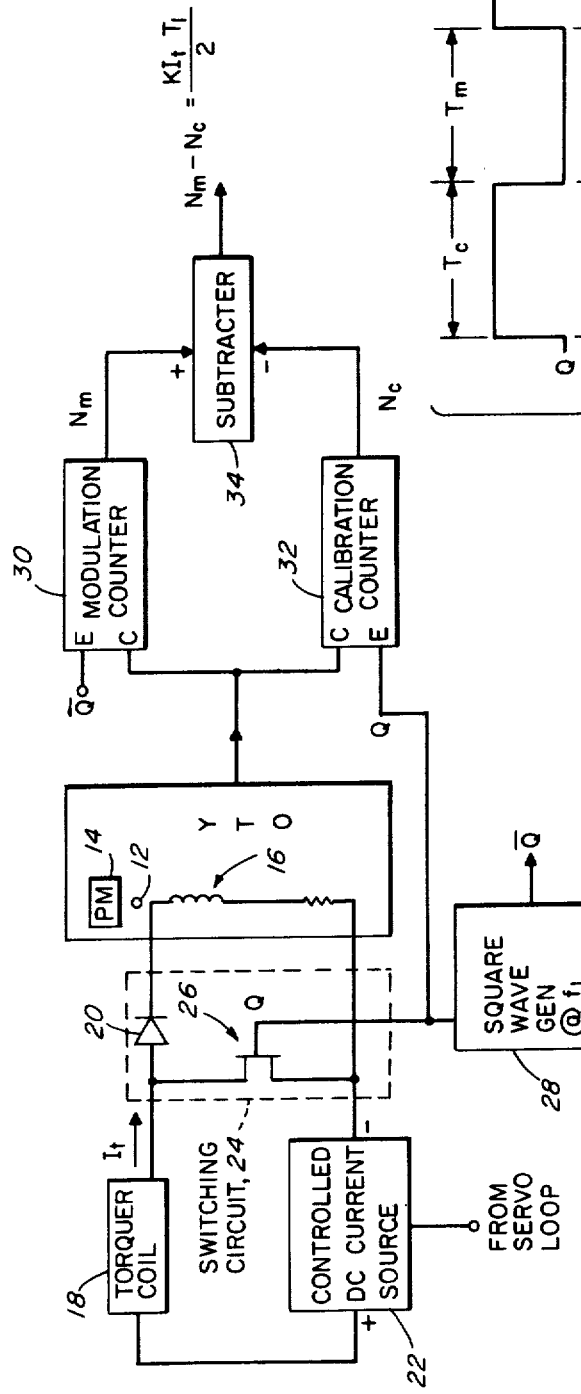
FIG. 3
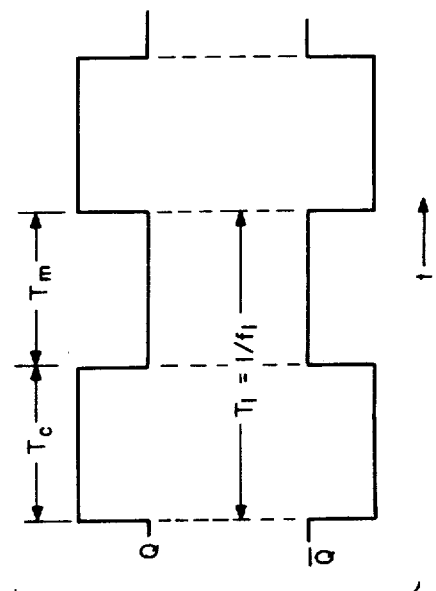
FIG. 4

TORQUER CURRENT READOUT SYSTEM FOR INERTIAL INSTRUMENT EMPLOYING CURRENT CONTROLLED OSCILLATOR

BACKGROUND OF THE INVENTION

The invention relates generally to the field of analog-to-digital and current-to-frequency converting systems, and more specifically to readout systems for inertial instrumentation employing analog torquer current.

Inertial instruments such as free rotor gyros frequently use torquer coils which either interact with a permanent magnet or produce an attracting magnetic field to reposition the inertial element. The torquer coils are driven by a servo loop responsive to pickoffs which sense displacement. The inertial element is thus repeatedly returned to a null position. The output of the inertial instrument is ordinarily provided to a digital computer. In many cases, the output to the computer is provided by measuring the torquer current instead of the pickoff signals. In some systems, the torquer is energized by discrete uniform pulses of current. Thus the torquer current is already in a computer-compatible digital format since the pulses can be counted. However, in certain applications there are advantages to using torquer current in an analog amplitude format, which must then be converted to a digital format appropriate for the computer. The aim of providing a numerical output precisely proportional to input current amplitude is often hampered by an environment rife with stray magnetic fields and temperature and power supply variations.

One way of converting analog current or voltage to frequency is to use an integrating voltage-to-frequency converter. The input current is converted to a voltage drop across a fixed sense resistor. The voltage is continuously integrated and then rebalanced by precisely controlled current pulses. The frequency of the pulses is directly related to the voltage amplitude. However, the high parts count and cost associated with the integrating voltage-to-frequency converter plus its poor bias stability are serious disadvantages.

SUMMARY OF THE INVENTION

The general purpose of the invention is to convert torquer current from its original analog form to a format compatible with digital circuitry with an exceptionally high degree of precision and stability in stray magnetic fields over a wide temperature range.

It has been discovered that a microwave communication-type current-modulated oscillator, preferably an yttrium-iron-garnet (YIG)-tuned oscillator, can be harnessed as a current-to-frequency converter without suffering the side effects of its inherent bias frequency instabilities. A special drift compensation system enables the converter to exploit the exceptional potential linearity of the YIG oscillator, or other oscillator with similar sensitivities, through a simply implemented bias frequency cancellation scheme.

In the preferred embodiment, the analog current to be measured (e.g., solenoid torquer current) energizes a tuning coil in a YIG-tuned oscillator (YTO) of the type previously used for microwave communications. The output frequency of the oscillator (e.g., on the order of one-half gigaHertz) is composed of a bias frequency term subject to drift and a term proportional to input current amplitude. The bias frequency of a YTO is extremely sensitive to temperature and spurious magnetic fields. Yet, when these factors are constant, the output frequency is highly linear with respect to the input current amplitude. A switching circuit is employed to gate the input current flowing to the tuning coil ON and OFF at a relatively low constant predetermined rate. The number of cycles in the high frequency output of the oscillator is counted separately for each period and then the accumulated count during the OFF period is subtracted from the count in the adjacent ON period to produce a computer-compatible difference count which is independent of the instabilities of the bias frequency.

The system is specifically designed for free rotor gyros with solenoid or D'Arsonval torquers employing analog current loops. In the solenoid embodiment, two opposite separately energized solenoid torquers are connected in series via respective switching circuits to matched, upper and lower respective tuning coils in the YTO. When the upper or lower coil is energized, the frequency (and thus the difference count) increases or decreases linearly with the current amplitude, respectively. In the D'Arsonval embodiment, opposed series-connected D'Arsonval torquer coils are connected in series with a single YTO tuning coil by means of a switching circuit adapted for bidirectional current.

The exceptional linearity of the YTO coupled with drift compensation produces a compact, low cost, stable, precision analog-to-digital converter with a relatively low parts count, and no need for temperature control or magnetic shielding.

BRIEF DESCRIPTION OF THE DRAWING

Other objects, features and advantages of the invention will appear from the following description of a preferred embodiment thereof, taken together with the accompanying drawings in which:

FIG. 1 is a simplified schematic representation and block diagram of a YTO;

FIG. 2 is a graph of the output frequency of the YTO of FIG. 1 versus tuning current amplitude;

FIG. 3 is a simplified schematic and block diagram of an analog-to-digital converter based on the YTO of FIG. 1 with drift compensation according to the invention;

FIG. 4 is a waveform diagram of complementary gating signals produced by the square wave generator of FIG. 3;

DESCRIPTION OF THE PREFERRED EMBODIMENTS

Figure 5:
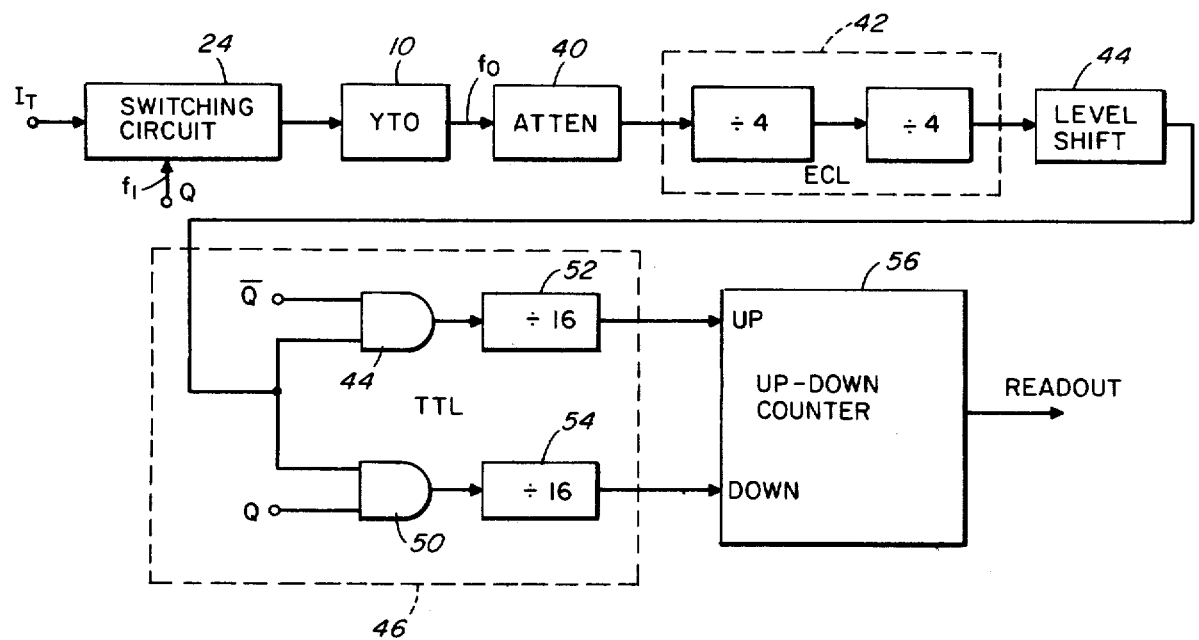
FIG. 5 is a block diagram illustrating a preferred embodiment of the oscillator output counting circuitry.

FIG. 1 illustrates the frequency control elements of a conventional YIG-tuned oscillator 10 (YTO) of the type developed and used for microwave communications. When a tiny sphere 12 of yttrium-iron-garnet (YIG) is subjected to a constant magnetic field, called a bias field, the sphere forms a sharply resonant microwave cavity. The bias field is provided by a permanent magnet 14, for example of Sm Co, but may be provided alternatively by an electromagnet. Gain to sustain oscillation is provided by a single transistor, preferably in a microwave integrated circuit (not shown). In addition to the bias field, an auxiliary variable magnetic field is applied to the YIG sphere 12 by a frequency modulation (FM) coil 16. Passing a modulation current $I_m$ through the FM coil 16, generates an auxiliary field which in turn changes the resonant frequency of the microwave cavity. The variation in the output frequency of the YTO is remarkably linear with respect to tuning current amplitude. As shown in FIG. 2, the output frequency $f_o$ can be expressed as a bias frequency term plus a term proportional to modulation current as follows:

$$f_o = (f_n + df_n) + K_m I_m,$$

where $f_n$ is a nominal or center frequency in the range of 450–4000 MHz, $df_n$ is the drift frequency due to temperature variations and stray magnetic fields, and $K_m$ is a proportionality constant. The bias frequency components account for the entire output of the YTO when the tuning current is zero.

For a YTO operating at about 1 gHz, the linearity of the frequency in relation to the amplitude of the tuning current is typically 0.05% over 1 decade. The tuning sensitivity in terms of the frequency increment produced by a unit of current can be on the order of 1 MHz/ma by design. However, the temperature instability is typically greater than 1% over the range of from about $-50°$ to about $+70°$ C. The magnetic susceptibility of the YTO is typically on the order of 70 kHz per Gauss. The extraordinary linearity of the YTO is compromised by these temperature and magnetic instabilities. Thermostatic temperature control is out of the question because of cost and reliability while special magnetic shielding would involve major design problems in many applications.

The present invention overcomes this problem by desensitizing a YTO-based converter against the effect of spurious magnetic fields and temperature variations. In simplified diagramatic form, FIG. 3 illustrates an embodiment of the invention which capitalizes on the exceptional potential linearity of the YTO to produce a numerical indication of torquer current. It represents the current flowing through a torquer coil 18 of the type used, for example, in repositioning the rotor of a dynamically tuned gyro. In the YTO the FM or tuning coil 16 is connected in series with the coil of the torquer 18 via a diode 20. A controlled DC current source 22 causes an analog current to flow through the circuit formed by the interconnection between the torquer 18, diode 20 and FM coil 16 and its associated internal resistance. The current source 22 is operated by a servo loop responsive, for example, to sensed displacement of the inertial element. In order to bypass the YTO, a switching circuit 24 is arranged between the FM coil 16 and the torquer 18 to provide a low resistance transistor shunt between the torquer 18 and current source 22. The bypass is gated by a MOS FET device 26 or other semiconductor element. The gate of MOS FET 26 is connected to a square wave generator 28 which produces a sampling signal Q (and its complement $\bar{Q}$) at the rate $f_l$, as shown in FIG. 4. The high portion of the sampling signal Q is designated $T_c$ for calibration period and the low portion is designated $T_m$ for modulation period. When the Q signal goes high the MOS FET 26 becomes instantly conductive (source to drain) shunting substantially all of the current away from the FM coil 16 back to the current source. Conversely, when the Q signal goes low the MOS FET device 26 becomes instantly nonconductive, and substantially all of the torquer current is switched through the FM coil 16. Assuming that the torquer current flowing through the FM coil 16 is in a direction to strengthen the magnetic flux vector intersecting the YIG sphere 12, then when the modulation period $T_m$ occurs, the output frequency of the YTO will be higher because of the additional component $K_m I_m$, and during the calibration periods $T_c$, the YTO output will be lower because the modulation term is zero.

The number of cycles of the YTO output is counted separately during the modulation period and the calibration period by a pair of counters 30 and 32. Modulation counter 30 is enabled by the Q signal going high during the modulation periods $T_m$. The calibration counter 32 is enabled during the calibration period $T_c$ then the Q signal is high. The output of the YTO (appropriately scaled for the counters as described below) forms clock pulse inputs for the counters 30 and 32. The output of the calibration counter 32 is subtracted from the output of the modulation counter 30 in a subtracter 34 which produces a difference count $N_m - N_c$. The combination of counters 30, 32 and subtracter 34 forms a differential counter. The total number of cycles counted during $T_m$ will be:

$$N_m = (f_n + df_n + K_m I_t) T_1 / 2$$

and the number counted during $T_c$ by counter 32 will be $$N_c = (f_n + df_n) T_1 / 2$$

The difference between these two counts is:

$$N_m - N_c = K_m I_t T_1 / 2$$

Thus the nominal frequency term $f_m$ and the drift term $df_n$ are cancelled leaving a net count proportional to $I_t$, the quantity to be measured. For best results, the calibration sampling frequency $f_l$ should be much lower than the oscillator nominal frequency $f_n$ and much higher than the expected variation frequency of the drift component.

Specific scaling and countdown circuitry for the YTO output is illustrated in the diagram of FIG. 5. The torquer current $I_t$ (0 to 100 ma, e.g.) is gated to the YTO 10 by the switching circuit 24. The nominal output frequency of the YTO is designed to be 600 MHz. The sampling frequency $f_l$ of the Q signal is set at 1 kHz with maximum torquer current on the order of 100 milliamps and a tuning sensitivity of 1 MHz per milliamp. The frequency of the YTO output is designed to swing from 600 to 700 MHz depending on the torquer. Since the 600 MHz output of the YTO is too high to be compatible with a digital computer, the objective of the scaling circuitry is to count the frequency down to a figure within the design range of the computer circuitry, i.e., below 10 MHz.

The output of the YTO in FIG. 5 is first passed to a 10–20 db attenuator 40 depending on the YTO output power to provide the proper level match to the countdown circuit 42. A Westmont Labs (Palo Alto, CA.) 50 milliwatt, 600 MHz YTO is preferably coupled to an Omni spectra 10 db pad. The attenuated YTO output containing alternating half millisecond periods $T_c$ and $T_m$ is fed to the two stage countdown circuit 42 which divides the output frequency by a factor of 16 with two standard emitter-coupled logic (ECL) chips, in order to bring the high frequency output of the YTO down to a range compatible with transistor-transistor logic (TTL) circuit 46. The logic amplitude levels are shifted by the level translator 44 to TTL compatible levels. The output of the level translator 44 forms one input to each of two complementary AND gates 48 and 50 in logic circuit 46. AND gates 48 and 50 are gated by the $\overline{Q}$ and Q signals, respectively. The outputs of the AND gates 48 and 50 are connected to respective standard divide-by-16 TTL chips 52 and 54 to complete the cummulative frequency division by 256. The outputs of the divide-by-16 chips 52 and 54 form the up and down, clock pulse inputs, respectively, to an up-down counter 56 (preferably Hewlett-Packard). As shown in FIG. 4, when the $\overline{Q}$ signal is high during the modulation period $T_m$, AND gate 48 output is enabled, divided by 16 and passed to the up-down counter 56 which increments its output register once every 256 cycles of the YTO output $f_o$. The alternately gated up-down counter forms a differential counter. Logic circuitry is arranged to pass the output of the up-down counter 56 at the end of the down counting period to a readout register and to reset the up-down counter 56 as it transitions from down counting to up counting. The readout can be implemented to produce an indication of counts per second, if desired.

In the up-down counter 56, the total number of cycles counted during the modulation period $T_m$ is:

$$N_m = \left( \frac{f_n + df_n \pm KI_t}{256} \right) T_1/2$$

and the number counted during the calibration period $T_c$ is:

$$N_c = \left( \frac{f_n + df_n}{256} \right) T_1/2$$

The difference is:

$$N_m - N_c = \frac{\pm KI_t T_1}{512}$$

The AND gates 48 and 50 are inserted before the final counter stages in order to increase the stability of the measurements since counting errors can be introduced at null due to edge transition jitter between Q and $\overline{Q}$.

Figure 6:
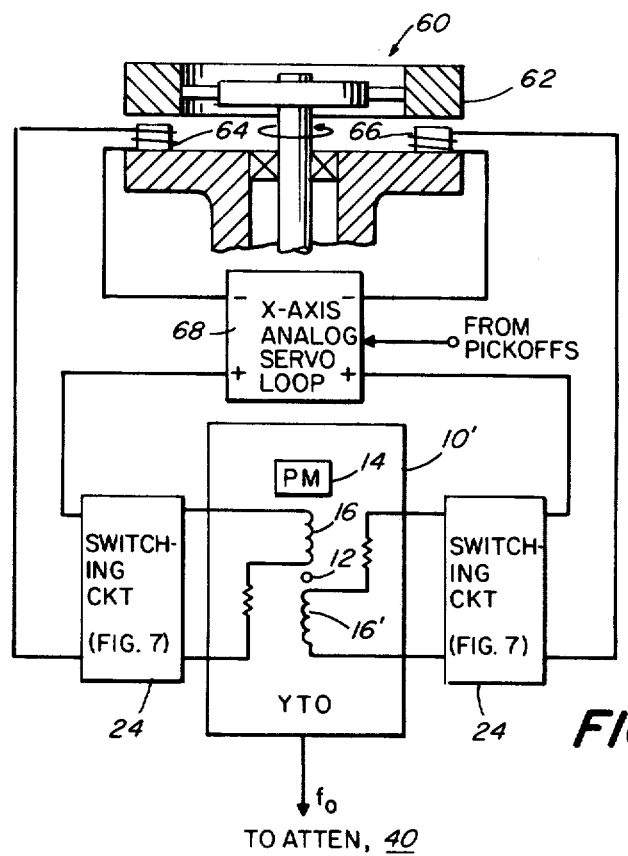
FIG. 6 is a simplified schematic and block diagram of a digital readout system for a solenoid torqued free rotor gyro.

FIG. 6 illustrates a current-to-frequency conversion system adapted for use with a free rotor gyro 60, preferably a dynamically tuned gyro. The gyro has a gimballed inertial rotor 62 of soft iron. The rotor is maintained in the normal plane by a set of four solenoid torquers (two per axis). Each torquer can only attract (not repel) the adjacent side of the rotor 62. The opposed X-axis torquers 64 and 66 are shown in the sectional view of FIG. 6. The torquers are operated independently by a bilateral X-axis analog servo loop 68. The servo loop 68 is responsive to signals from a complementary set of pickoffs (not shown) arranged to detect displacement of the rotor 62. Each torquer coil is connected in series with a respective FM tuning coil 16, 16' in a dual tuning coil YTO 10'. The upper and lower tuning coils 16 and 16' are connected via respective duplicate switching circuits 24 to solenoids 64 and 66, respectively. The tuning coils are opposed so that when current is flowing through the upper coil 16, it reinforces the bias magnetic field while the effect of current flowing in the lower coil 16' weakens the net magnetic field. Thus, during the modulation period, the YTO output frequency $f_o$ is either increased or decreased depending on which one of the torquers 64, 66 is energized. The output of the YTO 10' is passed to the attenuator 40 and counting circuitry, as in FIG. 5.

Figure 7:
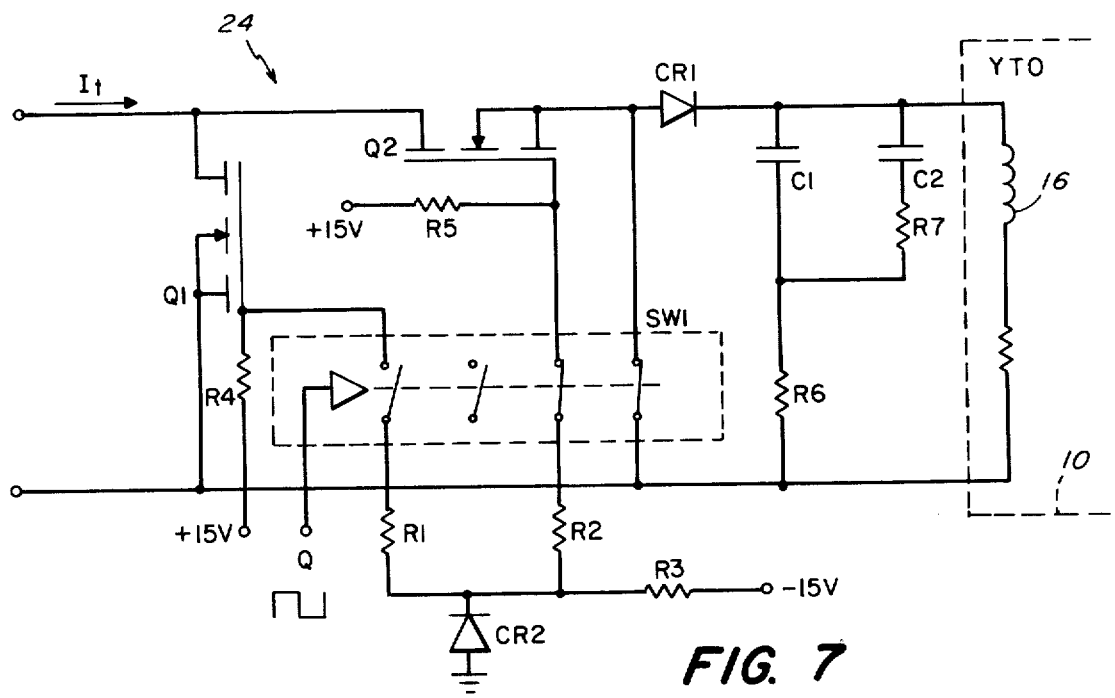
FIG. 7 is an electrical schematic diagram of a preferred embodiment of the switching circuit of FIGS. 3, 5, and 6.

A specific embodiment of the switching circuit 24 is shown in FIG. 7. This particular circuit is adapted for unidirectional currents characteristic of solenoid torquer gyros. Designed around semiconductor transistor devices Q1 and Q2, preferably the 2N6659 MOS FET, the circuit requires a TTL compatible drive signal for operation. During the calibration period $T_c$, the analog switch SW1 (e.g., DG 303) actuated by the Q sampling signal, assumes the condition shown in FIG. 7 to allow the gate of FET Q1 to be pulled up to +15 volts. This turns Q1 ON and the input current $I_t$ flows through Q1 and is shunted away from the YTO FM coil. At the same time, the analog switches connected to the gate and source of Q2 close, turning Q2 OFF. This action, in conjunction with diode CR1, provides high isolation of the FM coil 16 from the torquer current and prevents any reverse current flow through the coil. During the modulation period, $T_m$, the states of the FET's Q1 and Q2 are reversed by the analog switch, thereby directing current through the FM coil 16. The network composed of resistors R1–R3 and diode CR2 is used to balance the gate to source voltage when the FET's are in their OFF states, respectively. This insures that they are fully turned off, to minimize leakage currents. A compensation network consisting of capacitors C1 and C2 resistors R6 and R7 is included to suppress the voltage spikes produced by switching current into the inductive FM coil 16. Typical values for the compensation network for a 50 turn, 2.3 ohm, 25 mh tuning coil are as follows:

C1=3550 picofarads;
C2=0.022 microfarads;
R6=150 ohms;
R7=150 ohms.

Figure 8:
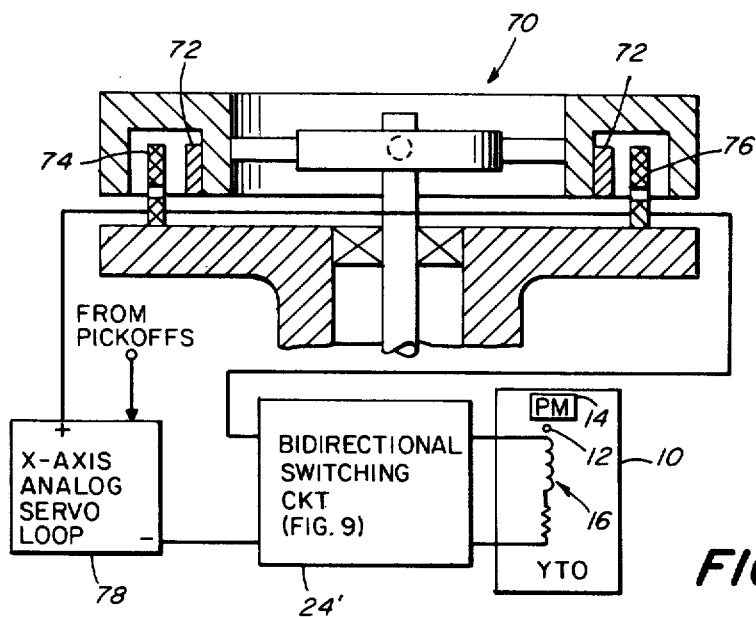
FIG. 8 is a simplified schematic and block diagram of a digital readout system for a D'Arsonval torqued free rotor gyro.

Another conventional torquing arrangement for free rotor gyros is the permanent magnet D'Arsonval coil system 70 shown in FIG. 8. A radially magnetized permanent magnet ring 72 is attached coaxially to the rotor and a set of four stationary coils (two per axis, e.g., coils 74,76) are arranged about the axis of rotation adjacent to the permanent magnet ring. The current through the coils produces an electromotive reaction force on the rotor in a direction which depends on the direction of the current in the coil. Opposite coils 74 and 76 are connected in series opposition so that when one coil causes the rotor to be forced up on one side the diametrically opposite companion coil simultaneously causes the rotor to be forced down on the other side. The opposite coils although separate are treated as one in terms of the torquer current amplitude common to both and are controlled by an analog servo loop 78 responsive to the pickoffs (not shown).

Figure 9:
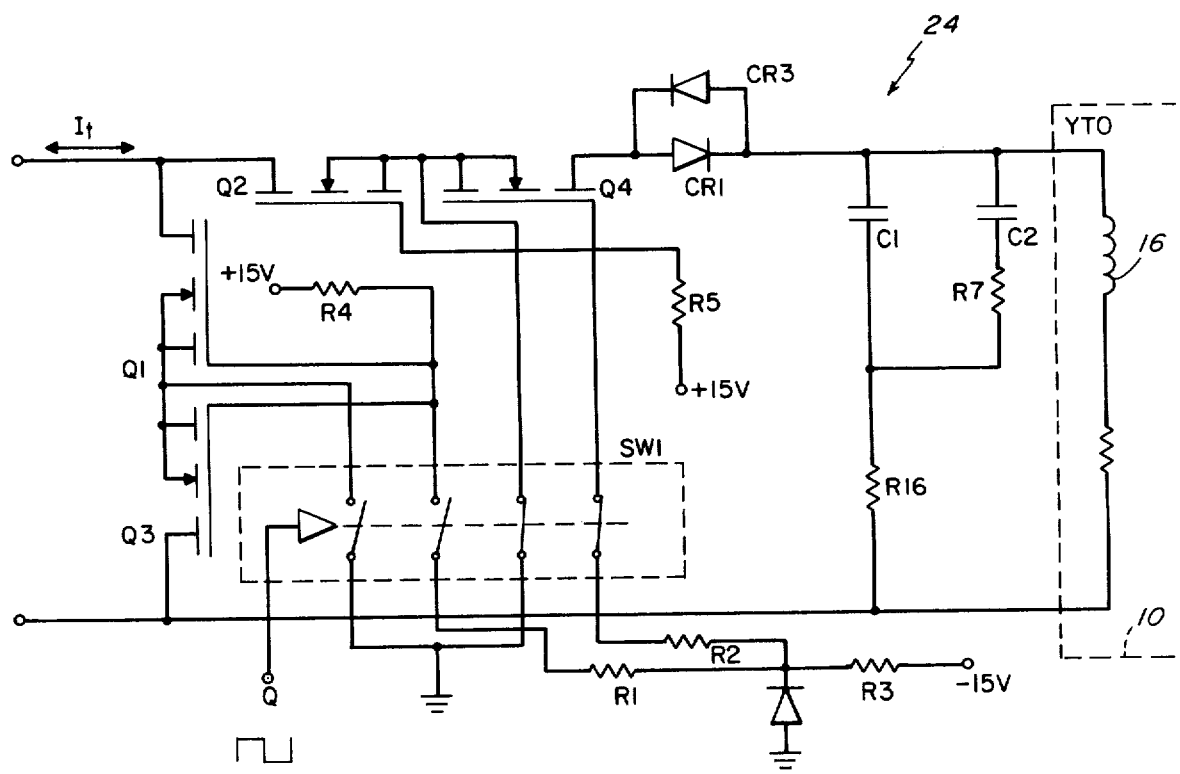
FIG. 9 is an electrical schematic diagram of the switching circuit of FIG. 7 modified for bidirectional currents.

In adapting the YTO system to a free rotor gyro with D'Arsonval torquers, only a single tuning coil 16 is required. However, a bidirectional switching circuit, as shown in FIG. 9 must be implemented to provide the same high isolation for negative currents as is provided in the unidirectional circuit for positive currents. The unidirectional circuit of FIG. 7 is modified for bidirectional currents by the addition of three components: Q3 and Q4 which are identical 2N6659V MOS FET's (BI-FET's) and diode CR3, an IN4148 switching diode identical to diodes CR1 and CR2. The circuit functions in the same manner as the unidirectional version.

A device constructed according to the invention was tested to observe the effect of four parameters: temperature, stray magnetic fields, variation in nominal operating frequency $f_n$ due to component aging (e.g., the magnet or YIG sphere) and power supply variation. A Westmont Labs OP-100 600 MHz YTO was used with an electromagnetic main bias coil, instead of a permanent magnet. The sensitivity of the YTO to temperature over a range of 35° 60° C. was found to be −496 kHz 1° C. or −751 parts per million per degree centigrade. With the calibration circuitry of FIG. 5 operating, ($f_l=1$ kHz) the output of the current-to-frequency converter was unchanged (−1 ±1 counts/sec.) over the temperature interval. The magnetic sensitivity of the YTO was found to be about 2.8 MHz/Gauss. However, varying the spurious magnetic field from 1 to 3 Gauss at the YIP sphere produced no change (−1±1 count/sec.) in the output of the current-to-frequency converter of FIG. 5 at $f_l=1$ KHz. At $f_l=100$ Hz, however, a manual variation of the stray magnetic field did produce a shift of ±20 counts/sec from null. Thus the sampling frequency $f_l$ should be chosen much higher than that of any external effects, particularly of variations in the stray magnetic field. 1 KHz appears to satisfy this requirement while 100 Hz does not. Fast periodic variations are not anticipated in the other parameters such as temperature. By deliberately tuning the nominal operating frequency over the operating range of 500–800 MHz, the effect of component aging could be studied. The current-to-frequency converter output remained at null (−1±1 count/sec.) irrespective of bias frequency over the entire operating range. The OP-100 YTO is designed to operate with a power supply of −15 V at 27.2 ma. Variations of from −10% to +20% (units of oscillator operation) did not affect null but changed the nominal operating frequency over a range of 2 MHz.

The results of these tests indicate a remarkable improvement in stability of the YTO as a current-to-frequency converter, from on the order of 1000 PPM to 0.1 PPM.

A system has been devised and disclosed herein for taking advantage of the exceptional potential linearity of the high frequency output of a YTO without suffering the effects of bias frequency drift due to temperature variation, spurious magnetic fields, and other variables. By electronically deleting the bias frequency, the uncontrolled drift components are automatically dynamically cancelled thus avoiding the need to control the temperature or to provide special magnetic shielding for the sensitive YIG sphere. The result is a highly precise, stable analog-to-digital converter particularly suited to analog torquer current measurement in precision inertial instruments.

Because the system is entirely electronic with a low parts count consisting mainly of integrated circuits, it is inexpensive and extremely reliable. Although the analog-to-digital converter described herein is specifically designed for inertial instrumentation, it is of course applicable to many other current measurement tasks.

While a particular preferred embodiment of the present invention has been illustrated in the accompanying drawing and described in detail herein, other embodiments are within the scope of the invention and the following claims.

What is claimed is:

1. In a readout system for an inertial instrument having a torquer coil for interacting magnetically with an inertial element when analog torquer current is passed through the coil, the improvement comprising means for measuring the current flowing through the torquer coil including:
    a current-controlled oscillator having a tuning coil connected in series with said torquer coil, and
    means responsive to the output of the oscillator for producing a digital output substantially proportional to torquer current.

2. In a readout system as set forth in claim 1, the further improvement wherein said oscillator is a current-controlled microwave oscillator.

3. In a readout system as set forth in claim 1, the further improvement wherein said oscillator is a YTO.

4. In a readout system as set forth in claim 1, the further improvement wherein said oscillator has means for producing an output frequency including a nominally constant bias frequency component subject to drift and a tunable frequency component dependent upon the input current amplitude through said tuning coil,
    said digital output producing means including:
        timing means for producing a binary sampling signal at a predetermined rate lower than the nominal bias frequency,
        switching circuit means for alternately causing said torquer current to pass through and to bypass said oscillator tuning coil periodically according to the rate of said sampling signal, and
        differential counter means responsive to said oscillator output and said sampling signal for producing a digital output indicative of the difference between the number of cycles of the oscillator output during alternate periods when the torquer current passes through and when the torquer current bypasses said tuning coil respectively, whereby said digital output is indicative of torquer current amplitude irrespective of said bias frequency.

5. In a readout system for an inertial instrument having opposed solenoid torquers for magnetically attracting the opposite sides of an inertial element, the improvement comprising means for measuring analog torquer currents through the respective solenoid torquers including:
    a current-controlled oscillator having dual opposed matched tuning coils each connected in series with a respective one of said solenoid torquers, and
    means responsive to the output of the oscillator for producing a digital output substantially proportional to the torquer current through either one of said solenoid torquers.

6. In a readout system as set forth in claim 5, the further improvement wherein said oscillator is a current-controlled microwave oscillator.

7. In a readout system as set forth in claim 5, the further improvement wherein said oscillator is a YTO.

8. In a readout system as set forth in claim 5 the further improvement wherein said oscillator has means for producing an output frequency including a nominally constant bias frequency component subject to drift and a tunable frequency component dependent upon the input current amplitude through either one of said tuning coils, said digital output producing means including:
  timing means for producing a binary sampling signal at a predetermined rate lower than the nominal bias frequency,
  switching circuit means for alternately causing said torquer current through either one of said solenoid torquers to pass through and to bypass the corresponding one of said oscillator tuning coils periodically according to the rate of said sampling signal, and
  differential counter means responsive to said oscillator output and said sampling signal for producing a digital output indicative of the difference between the number of cycles of the oscillator output during alternate periods when the torquer current passes through and when the torquer current bypasses said tuning coils respectively, whereby said digital output is indicative of torquer current amplitude through either solenoid torquer irrespective of said bias frequency.

9. In a readout system for an inertial instrument having opposed series-connected D'Arsonval torquer coils for interacting magnetically with an inertial element when analog torquer current is passed through the coils, the improvement comprising means for measuring the current flowing through the torquer coils including:
  a current-controlled oscillator having a tuning coil connected in series with both said torquer coils, and
  means responsive to the output of the oscillator for producing a digital output substantially proportional to torquer current.

10. In a readout system as set forth in claim 9, the further improvement wherein said oscillator is a current-controlled microwave oscillator.

11. In a readout system as set forth in claim 9, the further improvement wherein said oscillator is a YTO.

12. In a readout system as set forth in claim 9, the further improvement wherein said oscillator has means for producing an output frequency including a nominally constant bias frequency component subject to drift and a tunable frequency component dependent upon the input current amplitude through said tuning coil, said digital output producing means including:
  timing means for producing a binary sampling signal at a predetermined rate lower than the nominal bias frequency,
  switching circuit means for alternately causing said torquer current to pass through and to bypass said oscillator tuning coil periodically according to the rate of said sampling signal, and
  differential counter means responsive to said oscillator output and said sampling signal for producing a digital output indicative of the difference between the number of cycles of the oscillator output during alternate periods when the torquer current passes through and when the torquer current bypasses said tuning coil respectively, whereby said digital output is indicative of torquer current amplitude irrespective of said bias frequency.

13. A converter as set forth in claim 4, 8 or 12, wherein said switching circuit includes means for providing isolation of said oscillator means from said input current when said input current bypasses said oscillator means.

14. A converter as set forth in claim 13, wherein said oscillator means includes a tuning coil, and said isolation means includes:
  a first semiconductor switch operatively connected in series with said tuning coil, and
  a second semiconductor switch operatively connected in parallel with said tuning coil, said switching means further including means for alternately actuating said semiconductor switches in accordance with said sampling signal, said second semiconductor switch forming a bypass path for said input current.

15. A converter as set forth in claim 14, wherein said switching circuit further includes diode means connected in series between said first semiconductor switch and said tuning coil.

16. A converter as set forth in claim 15, wherein said switching circuit further includes RC network means connected in parallel across said tuning coil for compensating for the effect of the inductance of said tuning coil.

17. In a readout system for an inertial instrument having torquer coils aligned along at least one sense axis for interacting magnetically with an inertial element when analog torquer current is passed through one or more of said coils, the improvement comprising means for representing in digital form the amplitude of the current flowing through one or more of said torquer coils including:
  a current controlled continuous wave oscillator having a single resonant frequency determining element dependent on the net magnetic flux applied along a tuning axis,
  a first tuning coil juxtaposed with said element in alignment with said tuning axis,
  means for connecting said first tuning coil in series with one of said torquer coils, and
  means for counting the output of said oscillator over predetermined time periods.

18. The system of claim 17, wherein the improvement further comprises:
  a second tuning coil juxtaposed with said element in alignment with said tuning axis in opposed relationship to said first tuning coil, and
  means for connecting said second tuning coil in series with another one of said torquer coils aligned with the one torquer coil connected to said first tuning coil along a sense axis.

19. The system of claim 17, wherein the improvement further comprises:
  shunt means for shunting said first tuning coil with an equivalent circuit, and
  timing means for gating said shunt means.

20. The system of claim 19, wherein the improvement further comprises:
  control means for reversing the counting direction of said counting means whenever said timing means gates said shunt means.

* * * * *